(12) United States Patent  
Kim

(10) Patent No.: US 7,935,926 B2
(45) Date of Patent: May 3, 2011

(54) INSPECTION EQUIPMENT FOR FINE PATTERN AND MORPHOLOGY USING MICROCOLUMN

(76) Inventor: Ho Seob Kim, Chonan-si (KR)

(*) Notice: Subject to any disclaimer, the term of this patent is extended or adjusted under 35 U.S.C. 154(b) by 404 days.

(21) Appl. No.: 11/997,316

(22) PCT Filed: Jul. 31, 2006

(86) PCT No.: PCT/KR2006/003010
§ 371 (c)(1),
(2), (4) Date: Jan. 29, 2008

(87) PCT Pub. No.: WO2007/015615
PCT Pub. Date: Feb. 8, 2007

(65) Prior Publication Data
US 2008/0272298 A1 Nov. 6, 2008

(30) Foreign Application Priority Data
Jul. 30, 2005 (KR) .................. 10-2005-0070084

(51) Int. Cl.
*G01N 23/00* (2006.01)
(52) U.S. Cl. ............ 250/310; 250/492.1; 250/492.2
(58) Field of Classification Search .......... 250/310
See application file for complete search history.

(56) References Cited

U.S. PATENT DOCUMENTS

| 3,392,262 | A | * | 7/1968 | Hansen et al. | 219/121.13 |
| 4,390,789 | A | * | 6/1983 | Smith et al. | 250/492.2 |
| 4,764,818 | A | * | 8/1988 | Crew | 386/248 |
| 5,384,463 | A | * | 1/1995 | Honjo et al. | 250/398 |
| 5,399,860 | A | * | 3/1995 | Miyoshi et al. | 250/310 |
| 5,430,292 | A | * | 7/1995 | Honjo et al. | 250/310 |
| 6,740,889 | B1 | * | 5/2004 | Winkler et al. | 250/441.11 |
| 6,809,534 | B2 | * | 10/2004 | Yamada | 324/751 |

* cited by examiner

*Primary Examiner* — Phillip A Johnston
(74) *Attorney, Agent, or Firm* — John K. Park; Park Law Firm

(57) ABSTRACT

Inspection equipment using a microcolumn is disclosed. The inspection equipment of the present invention can conduct inspection of a fine circuit, which could not be conducted using conventional optical inspection equipment. Furthermore, the present invention can rapidly inspect a display, having a relatively large area, and can have a precise inspection function and a repair function. The inspection equipment of the present invention includes a plurality of microcolumns, a shaft, to which the microcolumns are coupled, and which is disposed in a direction perpendicular to a direction in which an object is moved, and a detector for detecting electron beams radiated from the microcolumns onto the object to determine whether errors exist in a circuit of the object.

20 Claims, 3 Drawing Sheets

[Fig. 1]
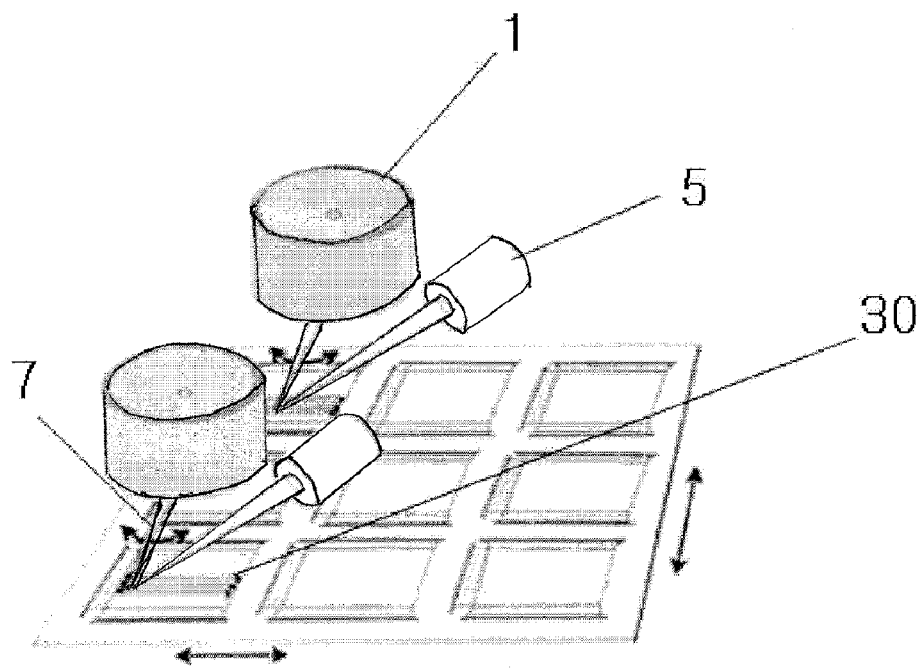
[Fig. 2]
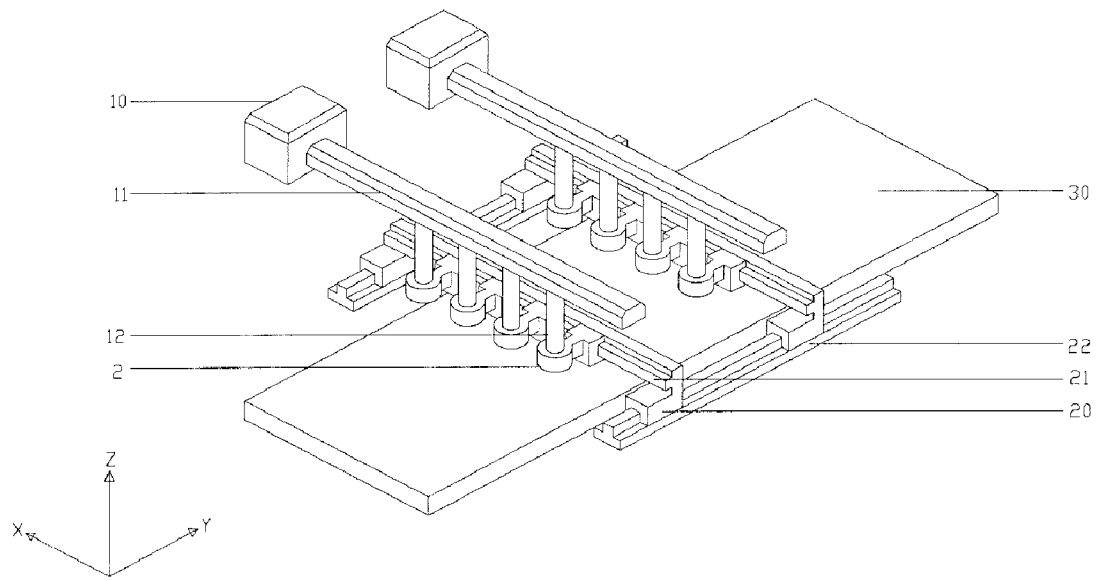

[Fig. 3]
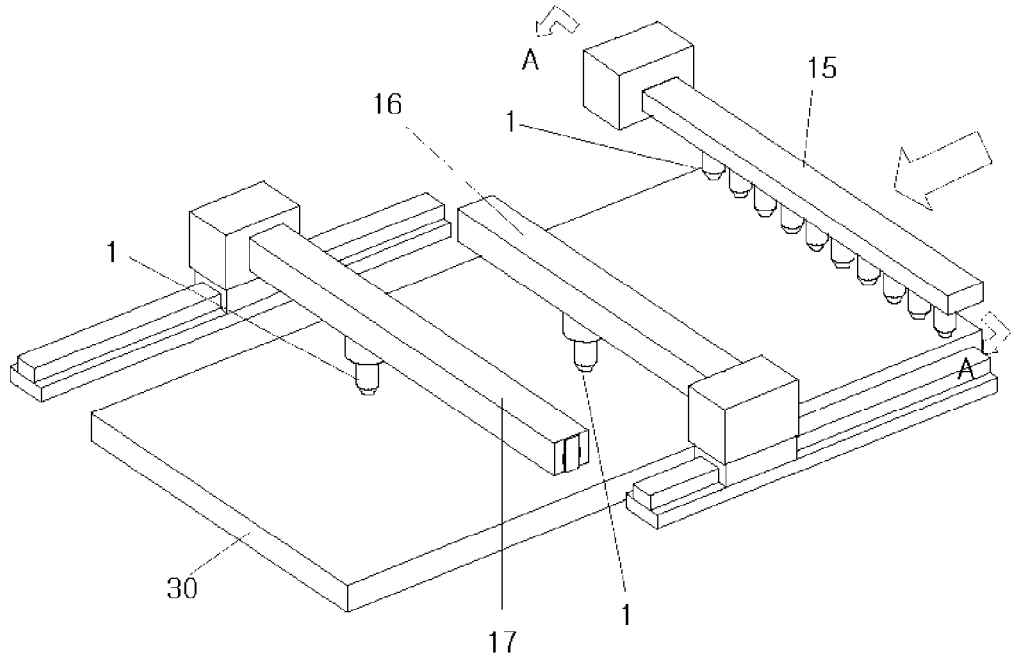
[Fig. 4]
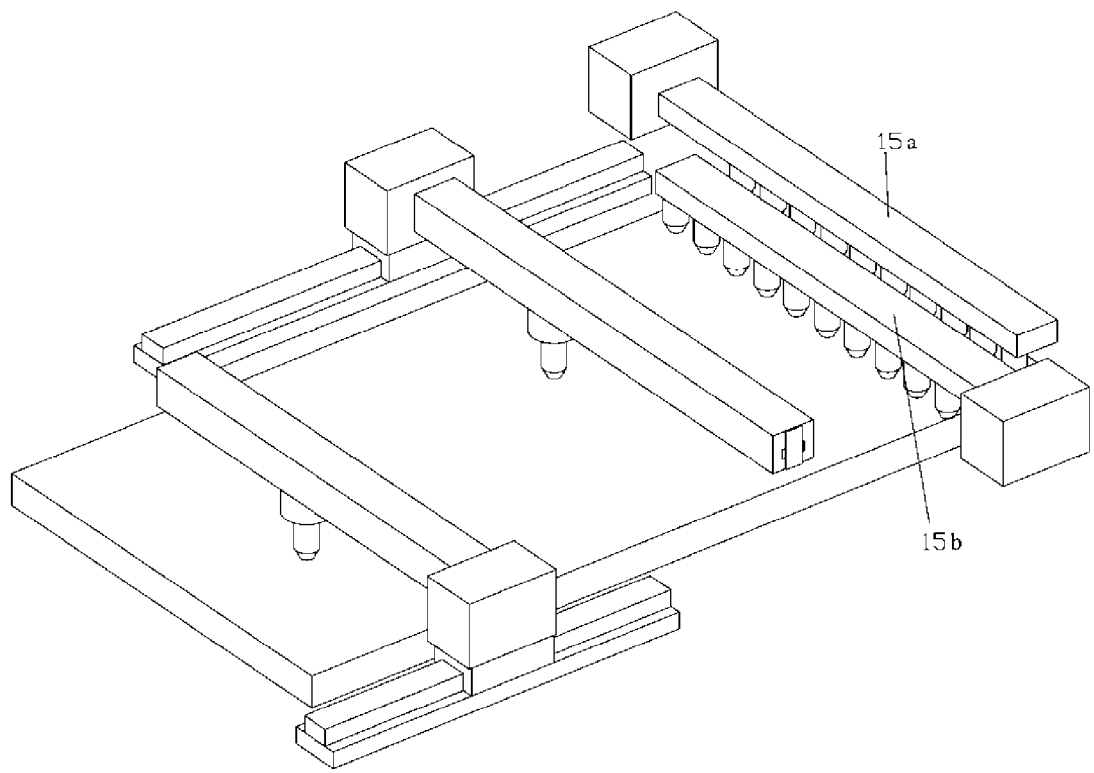

[Fig. 5]
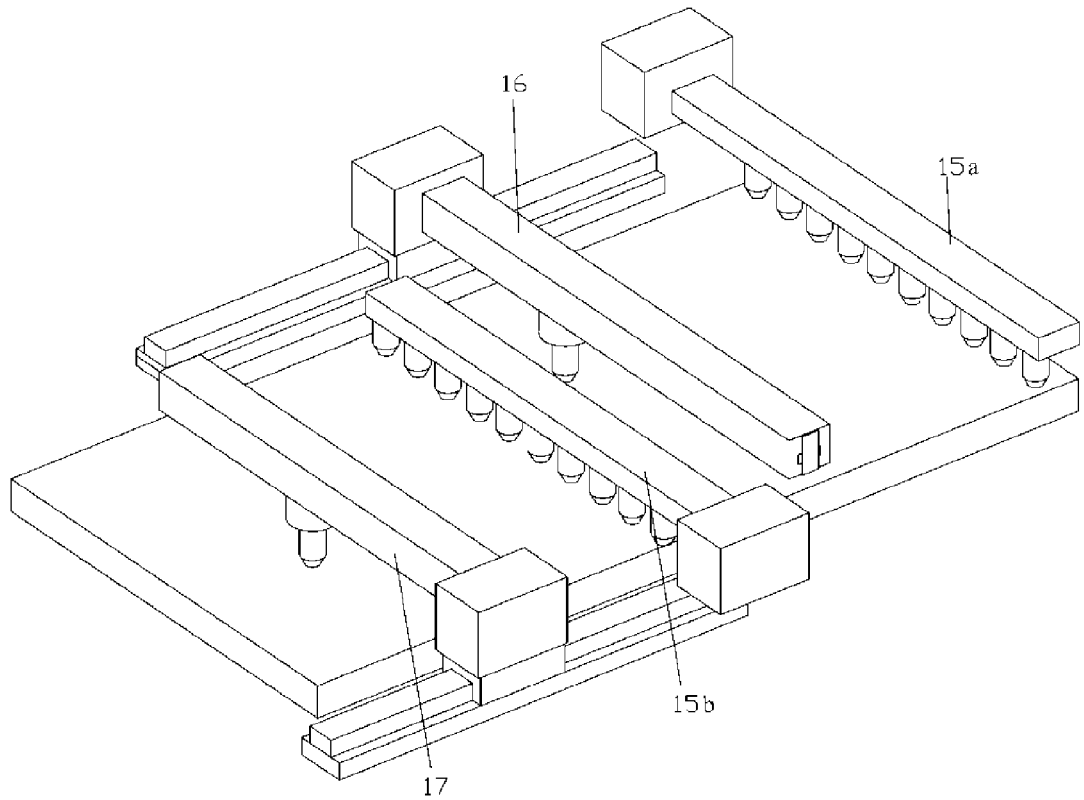
[Fig. 6]
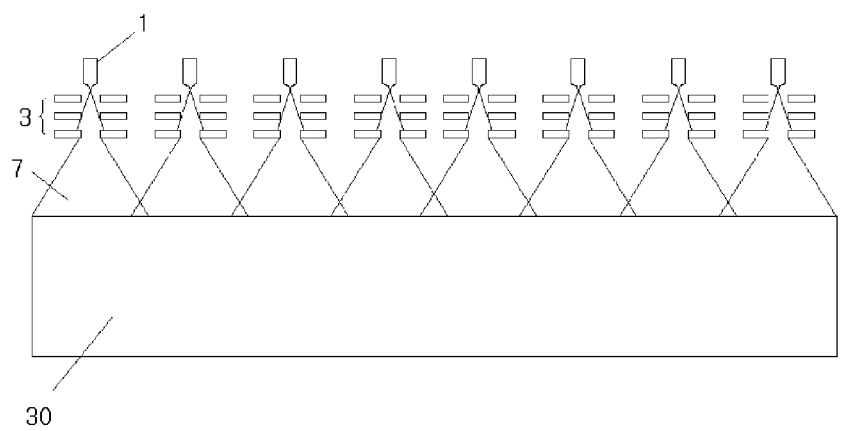

INSPECTION EQUIPMENT FOR FINE PATTERN AND MORPHOLOGY USING MICROCOLUMN

TECHNICAL FIELD

The present invention relates, in general, to inspection equipment of large area semiconductor wafer patterns or large area LCD and PDP panels during manufacturing (hereinafter called sample). The inspection equipment checks for errors in fine electric circuits (such as thin film transistor arrays), partition walls and/or the morphology of each pixel of a module in the sample. It rapidly inspects if errors exist by using a multi-microcolumn system and then analyzes and repairs them.

BACKGROUND ART

Conventional LCD module inspection equipments examine whether an error exists in each TFT pixel through a method proposed in Korean Patent Laid-open Publication No. 1999-017650, entitled "THIN FILM TRANSISTOR ARRAY TESTER", or through a method in which an electron beam (E-beam) is radiated onto an array of each pixel of a TFT to confirm current passing normally through the pixel. However, the spatial installation of the conventional LCD inspection systems is restricted due to the relatively large size of the E-beam emission devices. Hence a large number of E-beam emission devices cannot be assembled in one inspection system resulting in disadvantages as for example the necessity of movable structures and the serial scanning of the different scan fields in the sample. As such, the conventional inspection equipment requires a lot of time for inspection, and the installation and maintenance thereof is inconvenient. Therefore, the conventional inspection equipment can be used only for simple inspection in a TFT-LCD or PDP manufacturing process to respond to mass production. Furthermore, a portion of the object where errors are expected must be checked in a separate checking process, rather than during the manufacturing process.

DISCLOSURE OF INVENTION

Technical Problem

Accordingly, the present invention has been made by keeping the above problems in mind. It is to provide inspection equipment, which rapidly checks the presence of errors in a fine electric circuit, a partition wall and/or morphology of each pixel of a module of a semiconductor wafer pattern having a relatively large area or of a display apparatus, such as an LCD or PDP, having a relatively large area, and checks for problems.

Another object of the present invention is to provide inspection equipment which can also analyze and repair erroneous parts.

Technical Solution

In order to accomplish the above objects, the present invention provides inspection equipment, including a plurality of microcolumns; a shaft, to which the microcolumns are coupled, and which is disposed in a direction perpendicular to the direction in which an object is moved; and an electron detecting unit for detecting electron beams radiated from the microcolumns onto the object to determine whether errors exist in the object.

Furthermore, the inspection equipment of the present invention may further include movable shafts, which are movable in X and Y-axis directions, and microcolumns, which are coupled to respective movable shafts, thus precisely inspecting, analyzing and repairing the portions in which errors exist.

The present invention provides inspection equipment that may include a plurality of microcolumns; at least a first inspection unit that inspects an object at high speed and includes a shaft, to which the microcolumns are coupled, and which is disposed in a direction perpendicular to the direction in which the object is moved, and an electron detecting unit for detecting electron beams radiated from the microcolumns onto the object to determine whether errors exist in the object; and at least a second inspection unit provided behind the first inspection unit to precisely inspect the portion of the object in which errors exist, the second inspection unit including a movable shaft movable in X and Y directions, and a microcolumn coupled to the movable shaft.

The present invention is equipment for rapidly inspecting whether a fine circuit, such as a TFT of a display, is operating normally. In a TFT circuit process method, a problem of an error can be solved by an optical inspection device, but, in a TFT circuit drive method, a problem of an electric error cannot be solved by the optical inspection device. Therefore, the inspection equipment of the present invention inspects whether the TFT is operating normally using at least two microcolumns, which inspect whether electric drive errors exist in the TFT panel of the display, which has a relatively large area.

Furthermore, the inspection equipment of the present invention can precisely inspect a portion in which errors exist, and, as well, analyze and repair the portion having the errors.

As an example of use of the inspection equipment according to the present invention, electron beams are radiated from the microcolumns onto the TFT drive circuit. The existence of errors is checked by detecting a variation in secondary electrons emitted from the sample occurring in a circuit connected to the drive circuit.

Advantageous Effects

The inspection equipment according to the present invention using microcolumns can conduct inspection of a fine circuit, which could not be conducted using conventional optical inspection equipment. Furthermore, the inspection equipment of the present invention can rapidly inspect a display even if the display has a relatively large area.

Furthermore, thanks to the low energy characteristics of the microcolumn, damage to an object can be minimized. In addition, the present invention can check the pattern and morphology of the object to be inspected. That is, compared to the conventional E-beam emission equipment, which uses energies of several keV, the microcolumn of the present invention can obtain a high beam current image using only 1 to 2 keV of energy or less. Therefore, the present invention solves a conventional problem of damage to the object using electron beams having high efficiency.

Additionally, the inspection equipment of the present invention, using electron beams of the microcolumns, can inspect the object rapidly compared to conventional inspection equipment. As well, the present invention can overcome problems of spatial restriction.

BRIEF DESCRIPTION OF THE DRAWINGS

FIG. 1 is a perspective view illustrating the principle of the present invention;

FIG. 2 is a schematic perspective view showing an embodiment of equipment for inspecting fine patterns and morphology using a microcolumn, according to the present invention;

FIG. 3 is a schematic perspective view showing another embodiment of equipment for inspecting fine patterns and morphology using a microcolumn, according to the present invention;

FIG. 4 is a schematic perspective view showing another embodiment of equipment for inspecting fine patterns and morphology using a microcolumn, according to the present invention;

FIG. 5 is a schematic perspective view showing another embodiment of equipment for inspecting fine patterns and morphology using a microcolumn, according to the present invention; and FIG. 6 is a sectional view taken along the line A-A line of FIG. 3 to illustrate electron beams irradiating an object.

MODE FOR THE INVENTION

The principle of inspection equipment of the present invention will be explained with reference to FIG. 1. When electron beams 7 are radiated from respective microcolumns 1 onto an object 30, an electron detecting unit 5 determines whether a circuit is operating normally. If it is necessary to focus each electron beam 7, the electron beam 7 is focused and irradiates a very small portion of the object 30, but, if the amount of electrons in the electron beam 7 is abundant, the precise focusing process may not be required. In this case, because the electron beam 7 irradiates a relatively large portion at a time, an inspection process can be conducted more rapidly.

The same principle as that of a CRT or electron microscope. The microcolumn 1 includes an electron emission source, a source lens, a deflector and a focus lens (Einzel lens). The microcolumn 1 emits an electron beam in a vacuum state. Of course, depending on the intended purpose of the microcolumn, the presence or structure of the deflector or the lenses may be changed. For example, if deflection is unimportant, the role of the deflector can be performed by other lens. If focusing is unimportant, the focusing operation may be simply conducted, or may be omitted. Furthermore, the focusing operation and the deflecting operation may be conducted at the same time. As well, the deflecting and focusing operation may be conducted while emitted electrons are guided through the source lens.

The inspection equipment of the present invention takes advantage of the microcolumn's small size. Furthermore, the present invention has a structure such that the microcolumn moves with respect to the object, making it possible to further reduce the size of the inspection equipment. In addition, it may be constructed such that several microcolumns radiate electron beams onto a single object, thus reducing the time during which electron beams are scanned.

Meanwhile, the inspection equipment of the present invention must be used in a vacuum state due to the particular characteristics of the microcolumn. Therefore, the vacuum state must be kept constant to allow the electron beam emitted from the microcolumn to effectively reach the object, which results into the fact that the microcolumn must be used in a vacuum chamber.

However maintaining an ultra high vacuum state necessary for the usage of the microcolumn is very expensive. Also, the distance (working distance) between the microcolumn and the object onto which the electron beam is radiated ranges from 1 mm ~400 mm. Although, in the general microcolumn used as a SEM, the distance is short, it is preferable that the inspection equipment of the present invention is constructed in a vacuum chamber with a generally high vacuum state or a low vacuum state, for example $10^{-7}$ torr or less. The microcolumn is placed in a separate chamber so that it can be operated in an ultra high vacuum state ($10^{-8}$~$10^{-11}$ torr), while the sample stays in the low vacuum state. The electron beam can then be effectively emitted through the Einzel lens or the focusing lens. If electron beams are not emitted effectively, the vacuum of the column chamber or of the main chamber holding the object can be improved.

Hereinafter, the inspection equipment of the present invention will be explained in detail with reference to the attached drawings.

FIG. 2 is a schematic perspective view showing the inspection equipment using a microcolumn, according to an embodiment of the present invention. The inspection equipment must be used in a vacuum chamber due to the characteristics of the microcolumn, and the vacuum chamber is not shown in this drawing, which shows only the inspection device used in the vacuum chamber.

As shown in FIG. 2, microcolumns (not shown) are installed in respective holders 2. Four microcolumns are attached to each shaft 11 through connection members 12, so that a total of eight microcolumns is connected to the two shafts 11 in X-directional. Each X-directional shaft 11 may linearly move the related microcolumns using a drive unit 10, which operates the X-directional shaft 11. In this embodiment, the microcolumns are placed in the respective holders 2. Furthermore, the holders 2 of each X-directional shaft 11 are coupled to a support shaft 21 of a support unit 20. The support unit 20 is linearly moved along the Y-directional shaft 22 by a separate drive unit, thus linearly moving the microcolumns in a direction perpendicular to the X-directional shaft 11, that is, in the Y-axis direction. If the microcolumns are constructed such that they are able to move in directions perpendicular to the connection member 12 or are able to tilt, diverse motion of the microcolumns is possible. For diverse motions of the microcolumns, there are various methods, such as installation of a tilting means or a linear moving means for moving the microcolumns in directions perpendicular to the connection member 12. As another method, each microcolumn may be coupled to a robot arm, and thus may be moved independently in various directions. Various detectors may be used as an electron detecting unit 5. Furthermore, the electron detecting unit 5 may be mounted to or inserted in each holder 2, or, alternatively, may be coupled to a housing for each microcolumn. Various detectors, such as a back scattering electron detector, an SE detector, an MCP and a simple wire detector, may be used as the electron detecting unit 5. Furthermore, the detecting unit may be constructed of a combination of one more detectors. Here, the simple wire detector has a simple net shape or comprises a conductive wire having a linear, polyhedral, or circular shape. Such a simple wire detector mainly detects secondary electrons and/or back-scattered electrons. Meanwhile, a single detector may be used in one microcolumn, or, alternatively, a single detector may be connected to two or more microcolumns. In this case a single detector is connected to several microcolumns, when the microcolumns emit and scan electrons, the detector detects the electrons of the microcolumns at predetermined time intervals.

Furthermore, as another electron detecting unit, a sample current method to determine errors in a circuit of an object may be used without a separate detector. The sample current method is a method in which electrons of an electron beam that irradiates the object are detected through the circuit of the object itself. In detail, in the sample current method, when an electron beam emitted from the microcolumn irradiates a circuit in a desired inspection portion of the object, a sample current from a predetermined circuit line (for example, a grounded line in an LCD panel) of the object is measured using a separate jig or device. That is, through an image processing method using detected current data, image inspection of the desired portion can be conducted, and whether the circuit is operating normally can be determined. In this case, it is preferable that basic voltage be applied to a separate circuit line (for example, in the case of an LCD panel, a gate line or data line). Here, even if the pre-determined circuit line and the separate circuit line are selected vise versa, the sample current method can be used in the same manner.

To determine whether the circuit is operating normally through the sample current method, when electrons of the electron beams flow along a circuit in a portion onto which an electron beam is radiated, the amount of current from a desired circuit line is detected. In this method, whether detected current is a desired value (if electrons of the emitted electron beam flows normally, the desired amount of current is detected from the desired circuit line) is determined using the amount of current. Therefore, whether errors exist in the circuit can be easily determined. Furthermore, in the separate circuit line, when voltage is applied to the separate circuit lines adjacent to the predetermined circuit lines, whether the predetermined circuit lines are disconnected can be determined using data about peripheral charged electrons of the cut portion of the pre-determined circuit lines (in the sample current method, peripheral charged electrons are expressed through current data). That is, because electrons are charged only to a portion at which the predetermined circuit line is disconnected, this can be confirmed in the sample current, thus determining whether disconnections exist. Such a sample current method may be conducted in the same manner as an image processing method of the conventional electron column using a sample current. As well, it is possible to inspect a circuit using an image. As such, in the case that the sample current method is used, a separate apparatus that can apply predetermined voltage to a desired circuit of the object or a separate apparatus, such as an ammeter or a current amplifier, which can confirm whether electrons of an electron beam flow through the desired circuit line, are required.

Meanwhile, the object 30 is an array of TFT LCD having a relatively large area, a partition wall of a PDP, or a semiconductor wafer pattern having a relatively large area. The object 30 is carried by a separate drive means at a position at which an electron beam emitted from the microcolumn irradiates the object 30.

As described above, in this embodiment, to maintain each microcolumn in an ultra high vacuum state, the microcolumn is placed in the chamber defined in each holder 2, a separate vacuum wiring is set up, and an ultra high vacuum state is created in the chamber of the holder in which the microcolumn is placed using an ion pump. The vacuum wiring may be set up in the same manner as an electric or vacuum wiring used in a conventional X-Y robot or robot arm. In this case, the microcolumn can move in various directions, that is, in X, Y and Z directions, and in the direction in which the microcolumn is tilted. If construction allows the microcolumn to be tilted, it is preferable that the connection member 12, which is coupled to the holder 2 having the chamber, have a bellows shape.

FIG. 3 is a schematic perspective view showing another embodiment of inspection equipment of the present invention, in which microcolumns 1 are mounted to a support shaft 15 in a line. An object 30 is carried in the direction designated by the arrow. While the object 30 is carried at a predetermined speed, all of the microcolumns 1, which are disposed in a line (row), radiate electron beams onto the object 30 for inspection. Furthermore, two separate microcolumns 1, which are movable in X and Y directions and serve to precisely inspect the portion where an error is expected, are provided behind the first line of the microcolumns 1. The precise inspection process is conducted when a portion where an error exists is detected. To conduct the precise inspection, transport of the object 30 may be temporarily stopped, or, alternatively, the precise inspection process and transport of the object 30 may be simultaneously conducted. This is determined depending on the speed at which the object 30 is carried. As shown in FIG. 3, movable shafts 16 and 17 are movable to the left and right, that is, in the same direction as the direction in which the object 30 is carried. Each microcolumn 1, which is coupled to each movable shaft 16, 17, is movable in a direction perpendicular to the shaft. If the microcolumns 1, which are coupled to the respective movable shafts 16 and 17, are constructed such that they can be tilted, more precise inspection can be conducted. Furthermore, the microcolumns 1 may repair the portion of the circuit where errors exist using electron beams. This is conducted in the same manner as a conventional method of repairing a circuit using an electron beam. For this purpose a gas that can conduct deposition and etching processes when irradiated by an electron beam can be used. The gas is emitted to the part of the sample where the circuit is broken, so that the disconnected part can either be built up by vapor-deposition or undesirably protruding parts can be reduced.

FIG. 4 shows a modification of the embodiment of FIG. 3, in which two rows of microcolumns 1 are coupled to two support shafts 15a and 15b to further reduce the time at which an object is inspected.

Inspection equipment of FIG. 5 has a structure similar to that of FIG. 4, but a support shafts 15a and 15b are spaced apart from each other by a predetermined distance such that they can inspect different portions of an object, and movable shafts 16 and 17 (for precise inspection) are disposed behind respective support shafts 15a and 15b at positions corresponding to the portions to be inspected. As shown in FIG. 5, the portion of the object to be inspected is sectioned into halves, and the support shaft 15a and the movable shaft 16, acting as a pair, inspect and/or repair one half of the object, while the support shaft 15b and the movable shaft 17, acting as a pair, inspect and/or repair the other half of the object, thus conducting the inspecting and/or repairing processes more rapidly.

In the embodiments of FIGS. 3 and 4, the support shaft may be constructed such that it is movable in the same manner as that of FIG. 2. However, in the case of simple inspection, when the support shaft has a stationary structure, the time required for inspection may be reduced. Furthermore, in each embodiment, the two movable shafts are shown in the drawing, but the number of movable shafts may be changed, as long as there is at least one. As well, the microcolumn for simple inspection, the microcolumn for precise inspection or the microcolumn for repair may be constructed such that it is movable in a Z-axis direction or is able to tilt. To reduce the time required for inspection, it is preferable that only a precise inspection microcolumn be constructed such that it is movable in a Z-axis direction or can be tilted. Of course, this is optional depending on the intended purpose.

In the above figures, the rapid inspection and/or repair microcolumns move relative to the object. That is, construction may be such that the rapid inspection microcolumns are stationary while the object moves. Conversely, as shown in FIG. 5, construction may be such that the rapid inspection microcolumns move at high speed and inspect the object after the object has been carried to a fixed position, and, thereafter, the precise inspection and/or repair microcolumns move and precisely inspect and/or repair the portion of the object in which errors exists.

In the drawings of the above embodiments, the rapid inspection microcolumns are arranged in one or two rows, but the number of microcolumn rows may be varied as required. In the same manner, the precise inspection and/or repair microcolumns are movable in X, Y and Z-axis directions, and the number thereof may also be changed in consideration of working time, etc.

Preferably, in consideration of inspection time, the portion of the object to be inspected is divided into several areas, and each microcolumn conducts its particular function, that is, rapid inspection, precise inspection, or repair, in a corresponding area.

Furthermore, the rapid inspection microcolumn may conduct a precise inspection and/or repair function as well as having its own function, without requiring a separate precise inspection and/or repair microcolumn. Furthermore, the rapid inspection microcolumn may have no focusing lens, and the other lens provided in the rapid inspection microcolumn may have a focusing function. As such, depending on the intended purpose, the structure of the microcolumn may be changed. For example, the microcolumn may include the electron emission source, the source lens and the deflector, or, alternatively, may include only the electron emission source and the source lens, the latter also having the function of the deflector.

FIG. 6 is a sectional view taken along the line A-A of FIG. 3 to schematically show the progression of electron beams emitted from the microcolumns. As shown in the drawing, electron beams emitted from the microcolumns 1, which are arranged in a line, irradiate the entire width of the object 30 (such as a thin film array, etc.) while the object 30 is moved. Then, electron beams desirably irradiate the entire desired portion of the surface of the object 30, so that the entire surface of the object 30 can be inspected.

In the present invention, a single microcolumn may be used. Furthermore, a multi-microcolumn may be used. The multi-microcolumn may be manufactured as a combination of a plurality of single type microcolumns. In addition, there are various types of multi-microcolumns, such as a wafer type multi-microcolumn, which is manufactured through a semiconductor process.

Meanwhile, it is preferable that such inspection, analysis and repair processes be conducted in a single chamber. However, in consideration of productivity and convenience, several chambers may be classified into a vacuum chamber for inspecting a circuit, a partition wall and/or morphology, a chamber for analysis, and a chamber for repairing. Furthermore, the functions of two kinds of chambers may be combined in one chamber.

In the present invention, the microcolumns may move relative to the object while inspecting the object. In addition, during an inspection process, the object may be moved by a stage in the same manner as in the conventional art while the microcolumns move and inspect the object. That is, they may move relative to each other.

INDUSTRIAL APPLICABILITY

As described above, inspection equipment using a microcolumn according to the present invention is used for inspecting fine patterns and morphology. Furthermore, the inspection equipment for fine patterns and morphology using the microcolumn can be used as inspection equipment or repair equipment for inspecting a fine electric circuit, a partition wall structure, and/or the morphology of each pixel of a display, such as an LCD or PDP.

The invention claimed is:

1. Inspection equipment, comprising:
   a plurality of microcolumns;
   one or more first inspection units to inspect an object at high speed, the first inspection unit comprising a shaft, to which one or more chambers receiving one or more microcolumns are coupled, the shaft being disposed in a direction substantially perpendicular to a direction in which the object is moved, and one or more electron detecting units for detecting electrons occurred by radiating electron beams emitted from the microcolumns onto the object to determine whether errors exist in the object; and at least a second inspection unit provided behind the first inspection unit to precisely inspect a portion of the object in which errors exist, the second inspection unit comprising a movable shaft movable in X and Y directions, and a chamber receiving a microcolumn coupled to the movable shaft,
   wherein each microcolumn is independently movable along separate x and y shafts using separate drive units; and
   wherein the inspection equipment is constructed in a vacuum chamber with a vacuum state of 10-7 torr or less, and the chambers of the first inspection units and the second inspection unit for receiving microcolumns are operated in a vacuum state of $10^{-8} \sim 10^{-11}$ torr.

2. The inspection equipment according to claim 1, wherein the microcolumn provided in the second inspection unit conducts a precise inspection process and a repair process, and second inspection unit further comprises a movable shaft for repair, thus precisely inspecting and repairing the portion of the object in which errors exist.

3. The inspection equipment according to claim 1, wherein each of the microcolumns is movable in X, Y and Z axis directions and is tiltable.

4. The inspection equipment according to claim 1, wherein each of the microcolumns comprises a multi-microcolumn, a combination of single microcolumns, or a combination of a multi-microcolumn and a single microcolumn.

5. The inspection equipment according to claim 1, wherein the electron detecting unit comprises a plurality of electron detecting units, and each electron detecting unit corresponds to several microcolumns, and the electron detecting unit detects electrons while related microcolumns are sequentially operated.

6. The inspection equipment according to claim 1, wherein the electron detecting unit conducts the detecting process using a sample current method.

7. The inspection equipment according to claim 1, wherein the microcolumns and the object move with respect to each other, or only the microcolumns move to inspect or repair the object.

8. The inspection equipment according to claim 1, wherein each of the microcolumns comprises an electron emission source, a source lens and a deflector, or comprises an electron emission source and a source lens having a function of a deflector.

9. The inspection equipment according to claim 2, wherein each of the microcolumns is movable in X, Y and Z axis directions and is tiltable.

10. The inspection equipment according to claim 2, wherein each of the microcolumns comprises a multi-microcolumn, a combination of single microcolumns, or a combination of a multi-microcolumn and a single microcolumn.

11. The inspection equipment according to claim 2, wherein the electron detecting unit comprises a plurality of electron detecting units, and each electron detecting unit corresponds to several microcolumns, and the electron detecting unit detects electrons while related microcolumns are sequentially operated.

12. The inspection equipment according to claim 2, wherein the electron detecting unit conducts the detecting process using a sample current method.

13. The inspection equipment according to claim 2, wherein the microcolumns and the object move with respect to each other, or only the microcolumns move to inspect or repair the object.

14. The inspection equipment according to claim 2, wherein each of the microcolumns comprises an electron emission source, a source lens and a deflector, or comprises an electron emission source and a source lens having a function of a deflector.

15. The inspection equipment according to claim 3, wherein the electron detecting unit comprises a plurality of electron detecting units, and each electron detecting unit corresponds to several microcolumns, and the electron detecting unit detects electrons while related microcolumns are sequentially operated.

16. The inspection equipment according to claim 3, wherein the electron detecting unit conducts the detecting process using a sample current method.

17. The inspection equipment according to claim 3, wherein the microcolumns and the object move with respect to each other, or only the microcolumns move to inspect or repair the object.

18. The inspection equipment according to claim 3, wherein each of the microcolumns comprises an electron emission source, a source lens and a deflector, or comprises an electron emission source and a source lens having a function of a deflector.

19. The inspection equipment according to claim 5, wherein the electron detecting unit conducts the detecting process using a sample current method.

20. The inspection equipment according to claim 6, wherein the electron detecting unit conducts the detecting process using a sample current method.

* * * * *